(12) United States Patent
Majid et al.

(10) Patent No.: US 6,518,814 B1
(45) Date of Patent: Feb. 11, 2003

(54) HIGH-VOLTAGE CAPACITOR VOLTAGE DIVIDER CIRCUIT HAVING A HIGH-VOLTAGE SILICON-ON-INSULATION (SOI) CAPACITOR

(75) Inventors: Naveed Majid, Mohegan Lake, NY (US); Theodore Letavic, Putnam Valley, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/473,530

(22) Filed: Dec. 28, 1999

(51) Int. Cl.$^7$ .................................................. H03L 5/00
(52) U.S. Cl. ...................... 327/306; 327/334; 327/530; 327/565
(58) Field of Search ................................. 327/334, 306, 327/315, 331, 530, 532, 565; 307/109; 257/532

(56) References Cited

U.S. PATENT DOCUMENTS

| | | | | |
|---|---|---|---|---|
| 3,643,127 A | * | 2/1972 | Laupman | 315/101 |
| 3,835,353 A | * | 9/1974 | Hermstein et al. | 317/244 |
| 4,437,134 A | * | 3/1984 | Dupraz | 361/56 |
| 4,636,658 A | | 1/1987 | Arakawa | 307/350 |
| 5,485,292 A | | 1/1996 | Wong et al. | 327/56 |
| 5,600,186 A | * | 2/1997 | Song et al. | 307/125 |
| 5,796,296 A | * | 8/1998 | Krzentz | 327/545 |
| 5,910,738 A | * | 6/1999 | Shinohe et al. | 327/108 |
| 6,140,673 A | * | 10/2000 | Kohyama | 257/301 |

FOREIGN PATENT DOCUMENTS

| | | |
|---|---|---|
| EP | 0661749 A1 | 7/1995 |
| JP | 2142319 A | 5/1990 |

* cited by examiner

Primary Examiner—Terry D. Cunningham
(74) Attorney, Agent, or Firm—Steven R. Biren

(57) ABSTRACT

A high-voltage capacitive voltage divider circuit includes a high-voltage Silicon-On-Insulator (SOI) capacitor connected between a high-voltage terminal and a low-voltage terminal, and a low-voltage SOI capacitor connected between the low-voltage terminal and a common terminal. The voltage divider circuit also includes control circuitry for processing a signal generated at the low-voltage terminal in order to provide voltage-related control of a larger circuit employing the voltage divider circuit. The high-voltage SOI capacitor can include an oxide layer on a substrate, with a thinned drift region on the oxide layer, a thick oxide layer over the thinned drift region, and an electrode layer over the thick oxide layer, with the electrode layer and the thinned drift region forming capacitor plates insulated from each other by the thick oxide layer. The capacitive voltage divider circuit may advantageously form part of a Switched Mode Power Supply (SMPS), in which the high-voltage terminal is an output of a diode bridge rectifier of the SMPS, and a comparator is used to sense a stepped-down voltage at the low-voltage terminal and uses this stepped-down voltage to detect an under-voltage condition in the SMPS.

13 Claims, 2 Drawing Sheets

HIGH-VOLTAGE CAPACITOR VOLTAGE DIVIDER CIRCUIT HAVING A HIGH-VOLTAGE SILICON-ON-INSULATION (SOI) CAPACITOR

BACKGROUND OF THE INVENTION

The invention is in the field of capacitive voltage divider circuits, and relates more particularly to an improved high-voltage capacitive voltage divider circuit using a high-voltage Silicon-On-Insulator (SOI) capacitor.

In certain relatively high-voltage circuit applications, a circuit for generating a relatively low voltage proportional to the high voltage, and then using that low-voltage signal to control a circuit operation, is required. While various prior-art circuits for performing this function exist, they suffer from several significant drawbacks, particularly in the context of integrated circuit technology.

Thus, for example, a low voltage signal proportional to a sensed high-voltage signal can be generated by a simple resistive divider circuit. However, in such a circuit, the resistive divider will draw current, and thus dissipate power and generate heat, making such a solution particularly undesirable for integrated circuit applications. The power dissipation problem can be solved by using a capacitive divider circuit, but for relatively high-voltage integrated circuit applications, there has not heretofore been a capacitive component capable of being simply, economically and compactly formed in integrated circuit technology, thus requiring either a relatively large, expensive and uneconomical integrated circuit capacitive divider, or else the use of a discrete high-voltage capacitor, which has obvious drawbacks in terms of size, cost and complexity.

One example of a prior-art high-voltage capacitive divider circuit is shown in U.S. Pat. No. 5,485,292, having a common inventor with the instant application. In that reference, a high-voltage capacitor for use in a capacitor divider circuit is created by forming a plurality of series-connected capacitors using a dual-layer metallization with appropriate insulation formed on a field oxide layer. Although that configuration was an improvement over then-available constructions, by present standards the capacitor structure is relatively large, uneconomical and complex. Additionally, since capacitors must be connected in series to achieve the desired voltage breakdown level, each individual capacitor must be made larger than the total desired capacity to be achieved, thus further increasing the size and cost of the finished product.

One particular area in which a simple, compact and economical high-voltage capacitor divider circuit is required is in the area of Switched Mode Power Supply (SMPS) design. When SMPS circuits are designed to support universal mains, the AC input voltage will be in the range of 90–280 $V_{AC}$. In order to provide under-voltage protection for such circuits, it would be extremely desirable to have a high-voltage capacitive voltage divider circuit which overcomes the drawbacks of prior-art circuits.

Accordingly, it would be desirable to have a high-voltage capacitive divider circuit which is simple and compact in construction, economical to manufacture, and which can be easily fabricated in integrated form.

SUMMARY OF THE INVENTION

It is therefore an object of the present invention to provide a high-voltage capacitive voltage divider circuit which is simple and compact in construction, economical to manufacture, and easily fabricated in integrated circuit form.

In accordance with the invention, these objects are achieved in a high-voltage capacitive voltage divider circuit having a high-voltage SOI capacitor connected between a high-voltage terminal and a low-voltage terminal, a low-voltage SOI capacitor connected between the low-voltage terminal and a common terminal, and circuitry for processing a signal at the low-voltage terminal.

In a preferred embodiment of the invention, the high-voltage SOI capacitor includes an oxide layer on a substrate, a thinned drift region on the oxide layer, a thick oxide layer over the thinned drift region, and an electrode layer over the thick oxide layer. In this configuration, the electrode layer and the thinned drift region form capacitor plates insulated from each other by the thick oxide layer.

In a further preferred embodiment of the invention, the capacitive voltage divider circuit forms part of an SMPS, the high-voltage terminal is an output of a diode bridge rectifier of the SMPS, and a comparator is used to sense a stepped-down voltage proportional to a voltage at the output of the diode bridge rectifier and uses the stepped-down voltage to detect an under-voltage condition in the SMPS.

A high-voltage capacitive divider circuit in accordance with the present invention offers a significant improvement in that a simple, compact, economical to manufacture and easily-integrated construction can be achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

DESCRIPTION OF THE PREFERRED EMBODIMENTS

Figure 1:
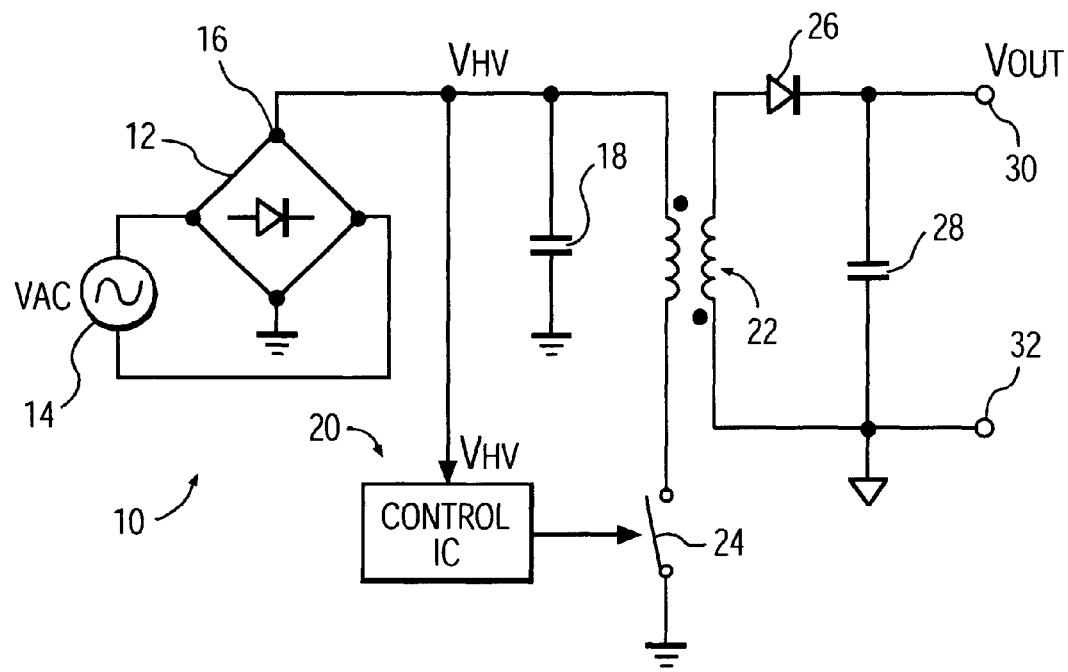
FIG. 1 shows a simplified schematic representation of a prior art SMPS in which the invention can be used.

In the simplified schematic diagram of FIG. 1, a prior art SMPS 10 is shown. Since this type of circuit is well known in the art, and is shown merely as an illustrative circuit in which the invention may be used, it is described here only in overview form.

The circuit includes a diode bridge rectifier 12, shown symbolically by a diamond with a diode symbol, having an ac input voltage 14 ($V_{AC}$) and an output terminal 16 at which a high-voltage $V_{HV}$ is generated. The voltage $V_{HV}$ is applied to a filter capacitor 18, a control IC 20 and the primary winding of a transformer 22. The control IC 20 is shown symbolically as controlling a switch 24 which serves to open and close a current 20 path through the primary of transformer 22 and thereby generate a varying voltage across the transformer primary in a known manner. The secondary winding of transformer 22 is shown as connected to a simplified rectifying and filtering circuit comprising a diode 26 and a capacitor 28, configured such that an output voltage $V_{OUT}$ is generated across output terminals 30 and 32.

In an SMPS designed to operate off of a universal mains voltage, in the range of 90–280 $V_{AC}$, the power supply may not operate properly if the input voltage $V_{AC}$ is below the minimum design value. Accordingly, it would be desirable for the control IC 20 to incorporate a protection feature designated Mains Under-Voltage Lock Out (MUVLO) in order to protect the SMPS against a drop in input voltage below the normal operating range for which the circuit is designed.

Figure 2:
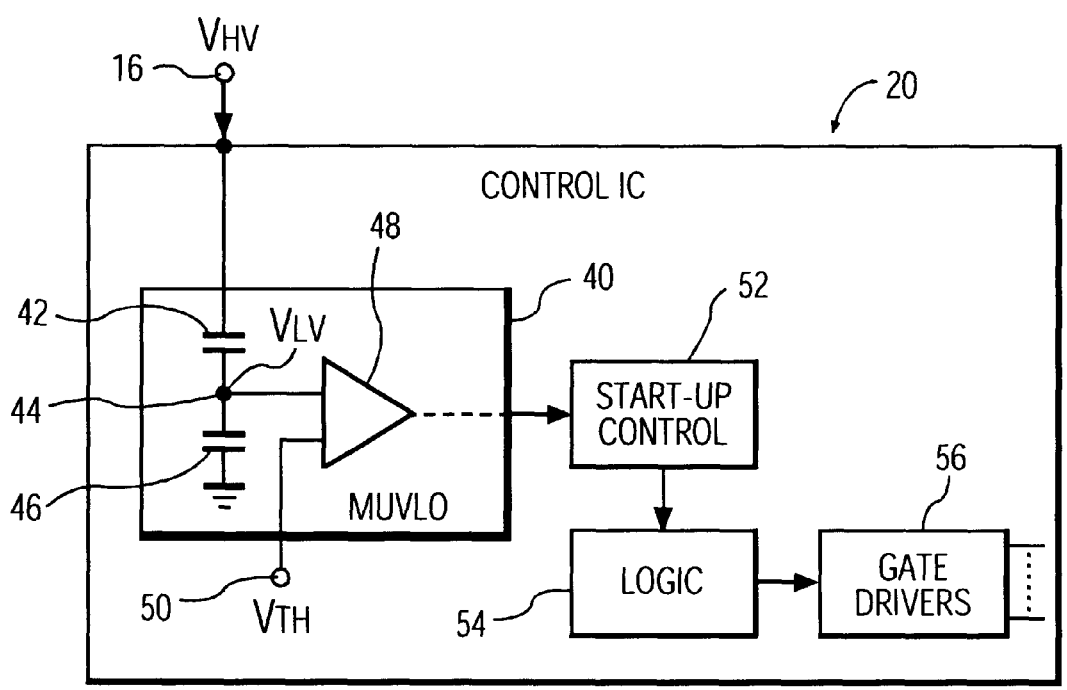
FIG. 2 shows a simplified block diagram of a control IC for use in the SMPS of FIG. 1 and incorporating a preferred embodiment of the invention.

FIG. 2 shows, in simplified block-diagram form, a configuration for the control IC 20 incorporating the MUVLO function. The MUVLO circuit is shown in simplified form within block 40, and includes a high-voltage SOI capacitor 42 connected between high-voltage terminal 16 and a low-voltage terminal 44, at which a voltage $V_{LV}$ is generated. A low-voltage SOI capacitor 46 is connected between the low-voltage terminal 44 and the primary circuit ground, and the low-voltage terminal 44 is also connected to a first input of a comparator 48, the second input of which is connected to a threshold reference terminal 50, to which a threshold reference voltage $V_{TH}$ is applied in operation. The output of MUVLO 40 is coupled to a start-up control block 52, which is in turn connected to various logic circuits designated by block 54, the outputs of which are coupled to gate drivers in block 56. Since blocks 52, 54 and 56 are of conventional design, they will not be described in further detail herein. Advantageously, blocks 40, 52, 54 and 56, as well as various other circuits, may be incorporated onto a single SOI integrated circuit to achieve a compact and economical construction.

In operation, upon start-up the application of an ac signal 14 causes the diode rectifier bridge 12 to generate a high-voltage signal $V_{HV}$ at terminal 16 (see FIG. 1), with this high-voltage signal being applied to the high-voltage SOI capacitor 42, as shown in FIG. 2. In accordance with well-known capacitive voltage-divider principles, the values of capacitors 42 and 46 can be selected such that a desired level of low voltage, proportional to the high-voltage at terminal 16, is generated at terminal 44 and provided to an input of comparator 48. The capacitor values are selected such that in normal operation the voltage $V_{LV}$ at terminal 44 will be greater than a selected threshold reference voltage $V_{TH}$ at terminal 50, thereby placing comparator 48 into a first state and providing an enable signal to start-up control block 52 to enable operation of the SMPS circuit. Should the voltage $V_{HV}$ at terminal 16 be lower than the minimum acceptable design value, as a result of a low mains input voltage $V_{AC}$, then the voltage $V_{LV}$ at terminal 44 will drop below the voltage $V_{TH}$ at terminal 50, and the comparator 48 in MUVLO circuit 40 will change state, thereby sending an inhibit signal to start-up control block 52 to prevent operation of the SMPS circuit. When the voltage $V_{LV}$ at terminal 44 returns to its normal value, corresponding to a mains voltage within the acceptable range, the comparator 48 will again change state, thus enabling start-up control block 52 and restoring the SMPS circuit to normal operation. In this manner a simple, compact and economical MUVLO circuit function is provided within a single IC.

Figure 3:
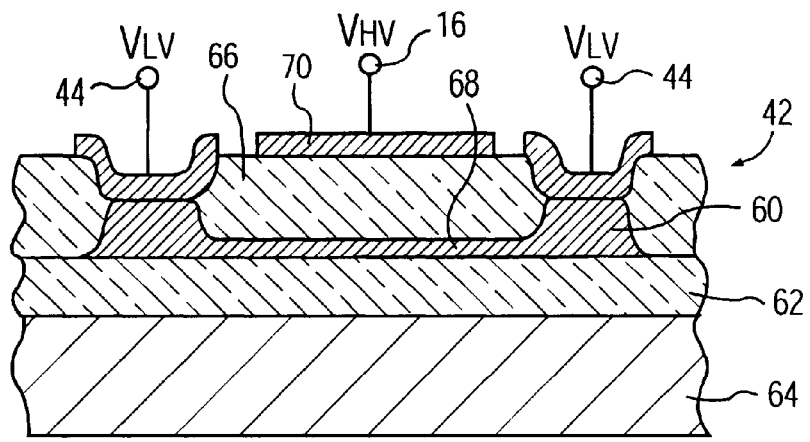
FIG. 3 shows a simplified cross-sectional view of a high-voltage capacitor for use in the high-voltage capacitive voltage divider circuit of the invention.
Figure 4:
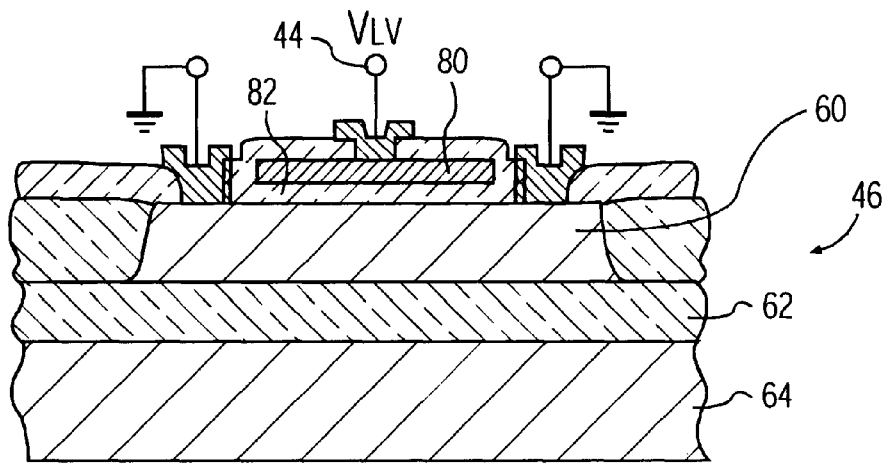
FIG. 4 shows a simplified cross-sectional view of a low-voltage SOI capacitor for use in the capacitive voltage divider circuit of the invention.

Representative examples of high-voltage and low-voltage SOI capacitors suitable for use in the capacitive voltage divider circuit of FIG. 2 are shown in simplified form in FIGS. 3 and 4 respectively. The high-voltage SOI capacitor 42 is implemented in an SOI construction (silicon layer 60 on insulating layer 62 on substrate 64), with a thick oxide layer 66 which may be formed by a known LOCOS process by oxidizing the silicon layer 60 to create a thinned drift region area 68 beneath the thick oxide layer 66. An electrode layer 70, typically of a metal such as aluminum, is provided on the surface of the thick oxide layer 66 opposite the thinned region 68, with electrode layer 70 and thinned drift region 68 forming capacitor plates insulated from each other by the thick oxide layer 66 to create a high-voltage capacitor construction in SOI technology. The capacitor plates are contacted by suitable metallization, as shown symbolically by connections 16 and 44 in the Figure. As compared to known prior-art constructions, the high-voltage SOI capacitor shown in FIG. 3 is simple, compact and economical, and can be easily integrated with the low-voltage SOI capacitor to be described below as well as various other control circuits within control IC 20.

A simplified cross-sectional view of a low-voltage SOI capacitor 46 suitable for use in the capacitive voltage divider circuit is shown in FIG. 4. This structure is of generally conventional design, and will therefore be described in overview fashion only. The low-voltage capacitor 46 can be fabricated on the same SOI structure (60, 62, 64) as the high-voltage capacitor 42, differing mainly in that electrode 80, serving as the upper plate of the capacitor can now be formed over a thin oxide layer 82, since this capacitor does not require a high breakdown voltage capability. Electrode 80, which may typically be formed of 5 polysilicon, is connected by metallization to low-voltage terminal 44, while the silicon layer 60, which serves as the other capacitor plate, is connected to ground by suitable metallization as shown in the Figure.

It is to be emphasized that the high-voltage and low-voltage SOI capacitors shown in FIGS. 3 and 4 may be fabricated in SOI technology using well-known processes for fabricating high-voltage and low-voltage SOI MOS transistors, and that the capacitors may vary in form and detail without departing from the spirit and scope of the invention.

Figure 5:
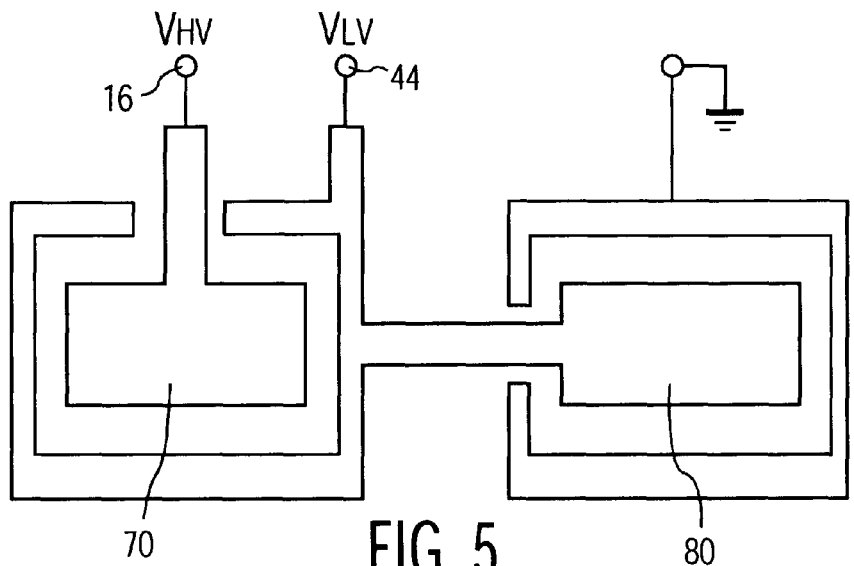
FIG. 5 shows a simplified plan view of the capacitor metallization of the high-voltage and low-voltage capacitors in accordance with the invention.

A simplified plan view of the upper capacitor plates 70 and 80, as well as the metallization connecting the plates to the high-voltage terminal 16, the low-voltage terminal 44 and ground, is shown in FIG. 5. It can be seen from FIG. 5 that the capacitor plates and metallization tracks are provided in a generally rectangular form, although it will be recognized that other shapes can be employed. Furthermore, it can be seen from FIG. 5 that, by providing the high-voltage and low-voltage capacitors adjacent to each other on the same SOI structure, a simple, compact and economical capacitor plate and metallization construction may be achieved.

In the foregoing manner, the present invention provides a high-voltage capacitive voltage divider circuit using SOI capacitors which is simple and compact in construction, economical to manufacture, and easily fabricated in integrated form, preferably on a single SOI integrated circuit also incorporating other control circuits.

While the invention has been particularly shown and described with reference to several preferred embodiments thereof, it will be understood by those skilled in the art that various changes in form and detail may be made without departing from the spirit or scope of the invention in this application it should be understood that the word "a" or "an"

What is claimed is:

1. A high-voltage capacitive voltage divider circuit comprising a high-voltage Silicon-On-Insulator (SOI) capacitor connected between a high-voltage terminal and a low-voltage terminal, a low-voltage SOI capacitor connected between said low-voltage terminal and a common terminal, and means for processing a voltage developed at said low-voltage terminal, wherein said high-voltage SOI capacitor comprises an oxide layer on a substrate, a thinned drift region on said oxide layer, a thick oxide layer over said thinned drift region, and an electrode layer over said thick oxide layer, said electrode layer and said thinned drift region forming capacitor plates insulated from each other by said thick oxide layer.

2. A high-voltage capacitive voltage divider circuit as in claim 1, wherein said high-voltage and low-voltage capacitors and said means for processing a voltage at said low voltage terminal are all formed in a single SOI chip.

3. The high-voltage capacitive voltage divider circuit as claimed in claim 1 wherein said high-voltage capacitor and said low-voltage capacitor are located adjacent to each other in a single silicon-on-insulator chip.

4. A combination high-voltage low-voltage capacitive voltage divider circuit in a silicon-on-insulator (SOI) chip and comprising:

a substrate, an insulation layer over the substrate, and a thin drift region of silicon on said insulation layer which together comprise an SOI chip, a high-voltage capacitor of the voltage divider circuit comprising an electrode layer and said thin drift region of silicon separated by a thick oxide layer insulator, a low-voltage capacitor of the voltage divider circuit comprising an electrode layer and a silicon layer separated by a thin oxide layer, and means for electrically contacting the thin drift region of silicon of the high-voltage capacitor and the electrode layer of the low-voltage capacitor so as to provide a common low voltage terminal for the combination capacitive voltage divider circuit.

5. A combination high-voltage low-voltage capacitive voltage divider circuit as in claim 4 further comprising means for processing a voltage developed at said low-voltage terminal, wherein said means for processing comprises a comparator having a first input connected to said low-voltage terminal and a second input connected to a threshold reference voltage.

6. The combination high-voltage low-voltage capacitive voltage divider circuit as claimed in claim 4 wherein said high voltage capacitor and said low-voltage capacitor are located adjacent to each other in said silicon-on-insulator chip.

7. The combination high-voltage low-voltage capacitive voltage divider circuit as claimed in claim 4 wherein said thin drift region of silicon of the high-voltage capacitor and the silicon layer of the low-voltage capacitor comprise respective plates of the high-voltage capacitor and the low-voltage capacitor, said respective plates of the high-voltage and low-voltage capacitors being electrically isolated from the substrate.

8. The combination high-voltage low-voltage capacitive voltage divider circuit as claimed in claim 4 further comprising a first electric contact to the electrode layer to provide a first external connection point of the high-voltage capacitor and a second electric contact to said thin drift region of silicon so as to provide a second external connection point of the high-voltage capacitor.

9. The combination high-voltage low-voltage capacitive voltage divider circuit as claimed in claim 4 wherein the electrode layer of the high-voltage capacitor comprises a high-voltage terminal of the combination capacitive voltage divider circuit and a strip of metal contacts the silicon layer of the low-voltage capacitor to form a terminal for connection to a circuit point of reference voltage.

10. A high-voltage capacitive voltage divider circuit comprising a high-voltage Silicon-On-Insulator (SOI) capacitor connected between a high-voltage terminal and a low-voltage terminal, a low-voltage SOI capacitor connected between said low-voltage terminal and a common terminal, and means for processing a voltage developed at said low-voltage terminal, wherein said high-voltage silicon-on-insulator capacitor is a single high-voltage silicon-on-insulator capacitor formed on a single silicon-on-insulator chip and comprising an electrode layer and a thinned drift region of silicon separated by a thick oxide layer insulator.

11. A combination high-voltage low-voltage capacitive voltage divider circuit formed in a single silicon-on-insulator chip and comprising:

a high-voltage SOI capacitor comprising an electrode layer and a thinned drift region of silicon separated by a thick oxide layer insulator, and in the single silicon-on-insulator chip in the vicinity of the high-voltage SOI capacitor, a low-voltage SOI capacitor comprising an electrode layer and a silicon layer separated by a thin oxide layer, and a metallization layer extending between and electrically contacting the thinned drift region of silicon of the high-voltage capacitor and the electrode layer of the low-voltage capacitor so as to provide a common low voltage terminal for the combination capacitive voltage divider circuit.

12. The combination high-voltage low-voltage capacitive voltage divider circuit as claimed in claim 11 wherein the electrode layer of the high-voltage capacitor comprises a high-voltage terminal of the combination capacitive voltage divider circuit and a strip of metallization contacts the silicon layer of the low-voltage capacitor to form a terminal for connection to a circuit point of reference voltage.

13. The combination high-voltage low-voltage capacitive voltage divider circuit as claimed in claim 11 wherein said high-voltage capacitor and said low-voltage capacitor are located adjacent to each other in said single silicon-on-insulator chip.

* * * * *